United States Patent
Jeong

(10) Patent No.: US 7,953,569 B2
(45) Date of Patent: *May 31, 2011

(54) ON DIE THERMAL SENSOR OF SEMICONDUCTOR MEMORY DEVICE AND METHOD THEREOF

(75) Inventor: Chun-Seok Jeong, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 279 days.

This patent is subject to a terminal disclaimer.

(21) Appl. No.: 12/290,034

(22) Filed: Oct. 24, 2008

(65) Prior Publication Data

US 2009/0072882 A1   Mar. 19, 2009

Related U.S. Application Data

(63) Continuation of application No. 11/527,849, filed on Sep. 26, 2006, now Pat. No. 7,451,053.

(30) Foreign Application Priority Data

Sep. 29, 2005 (KR) .............. 10-2005-0091666
Jun. 7, 2006 (KR) .............. 10-2006-0051145

(51) Int. Cl.
  *G01K 15/00* (2006.01)
  *G01K 13/00* (2006.01)
  *G06F 19/00* (2011.01)
  *G01R 31/26* (2006.01)

(52) U.S. Cl. ............ 702/99; 702/71; 702/104; 702/130; 374/141; 327/512; 324/765; 324/158.1

(58) Field of Classification Search .................... 702/71, 702/99, 104, 130; 374/141; 324/765, 158.1; 327/512

See application file for complete search history.

(56) References Cited

U.S. PATENT DOCUMENTS

| 5,282,685 | A | * | 2/1994 | Koegler .................. 374/172 |
| 5,784,328 | A | | 7/1998 | Irrinki et al. |
| 6,006,169 | A | * | 12/1999 | Sandhu et al. .............. 702/132 |
| 6,281,760 | B1 | | 8/2001 | Koelling et al. |
| 6,438,057 | B1 | | 8/2002 | Ruckerbauer |
| 6,756,856 | B2 | | 6/2004 | Song et al. |
| 6,976,782 | B1 | * | 12/2005 | Steger ................ 374/1 |
| 7,031,863 | B2 | * | 4/2006 | Maher et al. ............... 702/104 |
| 7,260,007 | B2 | * | 8/2007 | Jain et al. .............. 365/212 |
| 2006/0066384 | A1 | | 3/2006 | Jain et al. |
| 2006/0158214 | A1 | | 7/2006 | Janzen et al. |

FOREIGN PATENT DOCUMENTS

| KR | 1994-0004962 | 3/1994 |
| KR | 1999-0048860 | 7/1999 |
| KR | 10-2004-0013885 | 2/2004 |
| TW | 523758 | 3/2003 |
| TW | 579522 | 3/2004 |

* cited by examiner

*Primary Examiner* — Eliseo Ramos Feliciano
*Assistant Examiner* — Janet L Suglo
(74) *Attorney, Agent, or Firm* — Blakely Sokoloff Taylor & Zafman

(57) ABSTRACT

An on die thermal sensor (ODTS) includes a thermal sensor for outputting a first comparing voltage by detecting a temperature of the semiconductor memory device; a comparing unit for outputting a trimming code by comparing the first comparing voltage with a second comparing voltage and increasing or decreasing a preset digital code in response to the comparing result; and a voltage level adjusting unit for adjusting a voltage level of the second comparing voltage by determining a maximum variation voltage and a minimum variation voltage based on the trimming code and a temperature control code.

36 Claims, 7 Drawing Sheets

ON DIE THERMAL SENSOR OF SEMICONDUCTOR MEMORY DEVICE AND METHOD THEREOF

The present patent application is a Continuation of application Ser. No. 11/527,849, filed Sep. 26, 2006 now U.S. Pat. No. 7,451,053.

FIELD OF THE INVENTION

The present invention relates to an on die thermal sensor (ODTS) of a semiconductor memory device and a method thereof, and more particularly, to an ODTS and a method for automatically compensating a temperature error occurring due to an offset voltage between an internal circuit and an external device during processing.

DESCRIPTION OF RELATED ARTS

As operating speed of semiconductor memory devices increases, swing ranges of signals which are interfaced between the semiconductor memory devices become narrower in order to minimize delay time required for transferring the signals.

A unit memory cell of a dynamic random access memory (DRAM) device includes a transistor and a capacitor. The transistor performs a switching operation and the capacitor stores electric charges, i.e., data. In this time, the data has a logic level "HIGH" or a logic level "LOW" according to the electric charges stored in the capacitor.

Because of a characteristic of the capacitor, the electric charges are gradually reduced as time passes. Accordingly, a refresh operation which refreshes the stored data in the memory cell by every predetermined period is required to continuously maintain the stored data in the memory cell.

There is power consumption due to the refresh operation performed by a DRAM controller. Accordingly, in the battery operated system under a low power circumstance, it is important to reduce the power consumption due to the refresh operation.

One way to reduce the power consumption due to the refresh operation is to change a period of the refresh operation in response to a temperature. In a DRAM device, time for maintaining the data of the memory cell increases as the temperature decreases. After dividing the temperature into a plurality of regions, if an operating frequency of the refresh operation is lower under a low temperature region, it is possible to reduce the power consumption. Accordingly, it is required to detect the temperature of the DRAM device to lower the operating frequency of the refresh operation.

In addition, the DRAM device generates increasing heat as an integration level and an operating speed are increased. This heat raises an internal temperature of the DRAM device so as to disturb a normal operation of the DRAM device, thereby causing a fault of the DRAM device. As a result, it is required to detect the temperature of the DRAM device to output the detected result.

SUMMARY OF THE INVENTION

It is, therefore, an object of the present invention to provide an on die thermal sensor (ODTS) for automatically compensating a temperature error which occurs due to an offset voltage between an internal circuit of a semiconductor memory device and an external device during processing.

It is, therefore, another object of the present invention to provide a method for detecting an on die temperature of a semiconductor memory device, the method for accurately compensating a temperature error which occurs due to an offset voltage between an internal circuit of the semiconductor memory device and an external device during processing.

In accordance with an aspect of the present invention, there is provided an on die thermal sensor (ODTS) of a semiconductor device, including: a thermal sensor for outputting a first comparing voltage by detecting a temperature of the semiconductor memory device; a comparing unit for outputting a trimming code by comparing the first comparing voltage with a second comparing voltage and increasing or decreasing a preset digital code in response to the comparing result; and a voltage level adjusting unit for adjusting a voltage level of the second comparing voltage by determining a maximum variation voltage and a minimum variation voltage based on the trimming code and a temperature control code.

In accordance with another aspect of the present invention, there is provided an on die thermal sensor (ODTS) of a semiconductor device, including: a thermal sensor for outputting a first comparing voltage by detecting a temperature of the semiconductor memory device; a comparing unit for outputting a first trimming code in case of a first test mode and a thermal code in case of a second test mode by comparing the first comparing voltage with a second comparing voltage and increasing or decreasing a preset digital code in response to the comparing result; a voltage level adjusting unit for determining a maximum variation voltage and a minimum variation voltage based on the first trimming code in case of the first test mode and a preset second trimming code in case of the second test mode, thereby adjusting a voltage level of the second comparing voltage in response to a temperature control code; and a decoding selection unit for decoding a preset thermal information code in case of the first test mode and the thermal code in case of the second test mode, thereby outputting the temperature control code.

In accordance with a further aspect of the present invention, there is provided a method for detecting an on die temperature of a semiconductor memory device, the method including the steps of: (a) outputting a first comparing voltage by detecting temperature variation of the semiconductor memory device; (b) generating a trimming code by comparing the first comparing voltage with a second comparing voltage and increasing or decreasing a preset digital code in response to the comparing result; (c) adjusting voltage levels of a maximum variation voltage and a minimum variation voltage based on the trimming code; and (d) determining a voltage level of the second comparing voltage based on the maximum variation voltage and the minimum variation voltage so that the voltage level of the second comparing voltage is substantially the same as that of the first comparing voltage.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, an on die thermal sensor (ODTS) in accordance with the present invention will be described in detail referring to the accompanying drawings.

Figure 1:
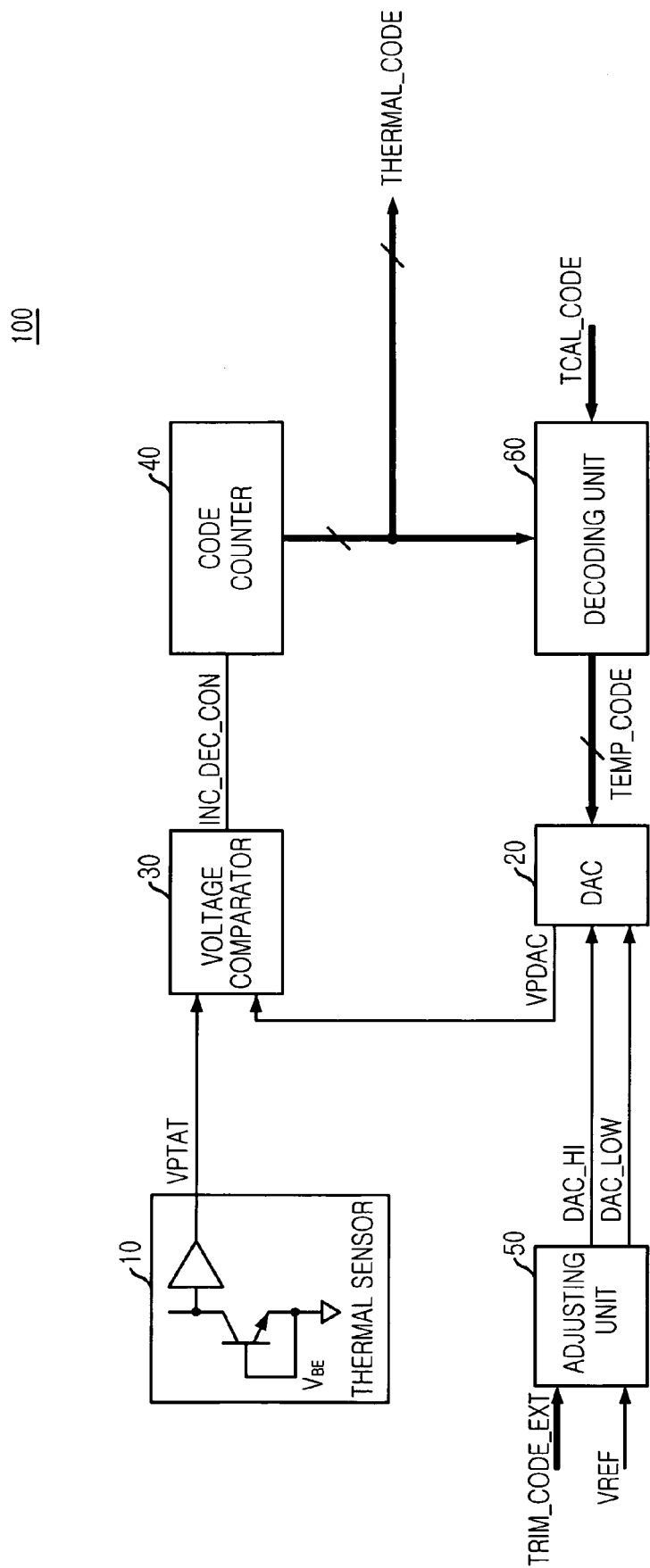
FIG. 1 is a block diagram of an on die temperature sensor (ODTS) of a semiconductor memory device in accordance with a first embodiment of the present invention.

FIG. 1 is a block diagram of an on die thermal sensor (ODTS) of a semiconductor memory device on accordance with a first embodiment of the present invention.

The ODTS 100 includes a thermal sensor 10, a digital to analog converter (DAC) 20, a voltage comparator 30, a code counter 40, an adjusting unit 50, and a decoding unit 60.

The thermal sensor 10 detects a temperature of the semiconductor memory device based on a base-emitter voltage $V_{BE}$ variation of a bipolar junction transistor (BJT) provided in a bandgap circuit which is not under the influence of temperature and power supply voltage variation of the semiconductor memory device. Herein, the base-emitter voltage $V_{BE}$ variation of the BJT is about −1.8 mV/° C. In addition, the thermal sensor 10 amplifies the base-emitter voltage $V_{BE}$ variation of the BJT which slightly varies, thereby outputting a first comparing voltage VPTAT corresponding to the temperature with the ratio of 1:1. That is, as the temperature of the semiconductor memory device is higher, the base-emitter voltage $V_{BE}$ variation of the BJT is lower.

The DAC 20 receives a maximum variation voltage DAC_HI and a minimum variation voltage DAC_LOW from the adjusting unit 50 and outputs a second comparing voltage VPDAC in response to a temperature control code TEMP_CODE output from the decoding unit 60. Herein, the temperature control code TEMP_CODE is a digital value.

The voltage comparator 30 compares the first comparing voltage VPTAT with the second comparing voltage VPDAC to output a code control signal INC_DEC_CON. When the first comparing voltage VPTAT is smaller than the second comparing voltage VPDAC, the code control signal INC_DEC_CON is outputted to decrease a digital code preset by the code counter 40. When the first comparing voltage VPTAT is larger than the second comparing voltage VPDAC, the code control signal INC_DEC_CON is outputted to increase the digital code preset by the code counter 40.

The code counter 40 increases or decreases the preset digital code in response to the code control signal INC_DEC_CON output from the voltage comparator 30, and outputs a thermal code THERMAL_CODE having temperature information.

The adjusting unit 50 receives a reference voltage VREF from the bandgap circuit which is not under the influence of temperature and power supply voltage variation of the semiconductor memory device, and outputs the maximum variation voltage DAC_HI and the minimum variation voltage DAC_LOW. Accordingly, the maximum variation voltage DAC_HI and the minimum variation voltage DAC_LOW also are not under the influence of temperature and power supply voltage variation of the semiconductor memory device. At this time, a range of the base-emitter voltage $V_{BE}$ variation of the BJT according to the temperature during processing the semiconductor memory device is different for each die. Therefore, a trimming code TRIM_CODE_EXT input from an external source is required to accurately compensate the temperature by controlling voltage levels of the maximum variation voltage DAC_HI and the minimum variation voltage DAC_LOW. A voltage difference between the maximum variation voltage DAC_HI and the minimum variation voltage DAC_LOW is uniformly maintained.

The decoding unit 60 outputs the temperature control code TEMP_CODE to the DAC 20 by decoding the thermal code THERMAL_CODE output from the code counter 40. Herein, the temperature control code TEMP_CODE is used for removing an error due to a transmission time difference which occurs when the DAC outputs the second comparing voltage VPDAC to the voltage comparator 30.

Figure 2A:
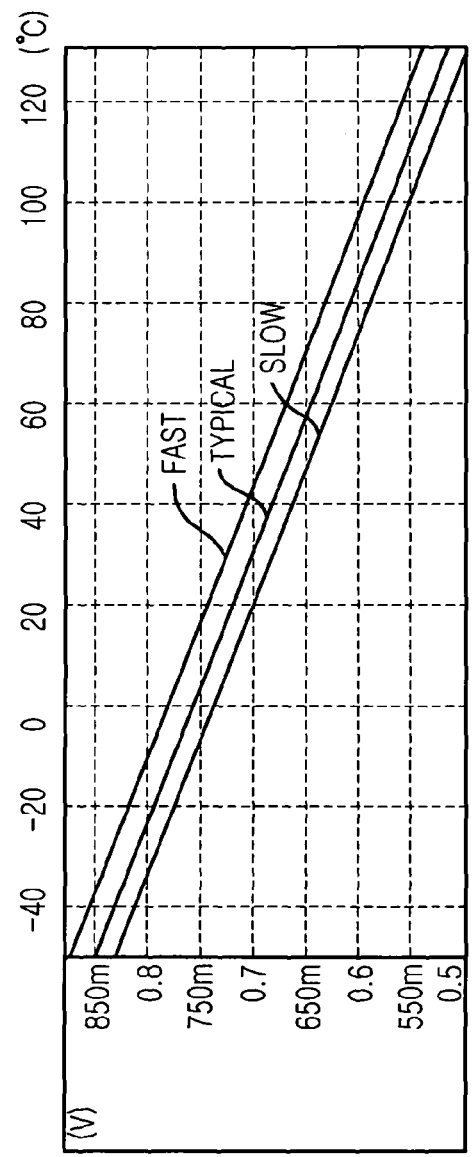
FIG. 2A is a waveform showing a base-emitter voltage of a bipolar junction transistor (BJT) to temperature.
Figure 2B:
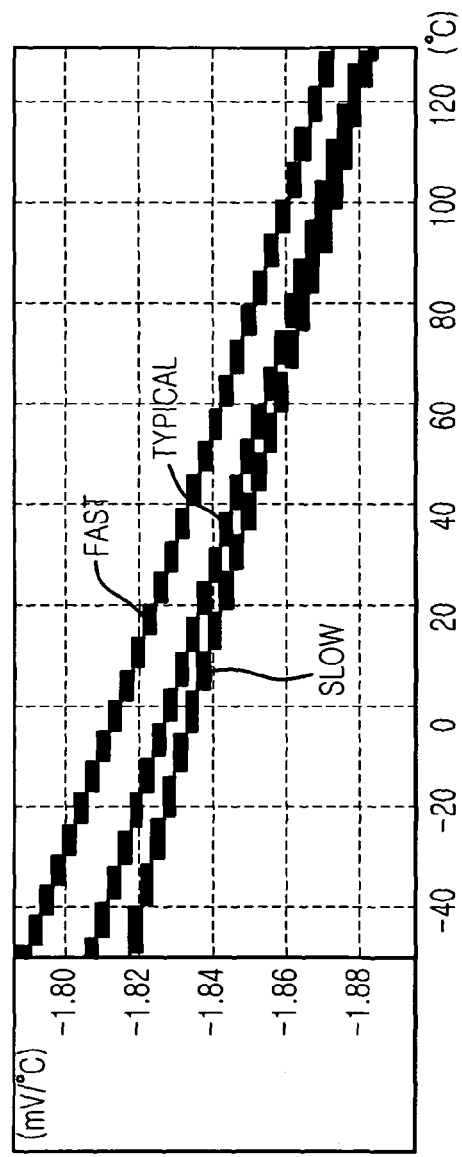
FIG. 2B is a waveform showing a base-emitter voltage variation of a BJT to temperature.

FIG. 2A is a waveform showing the base-emitter voltage $V_{BE}$ of the BJT to the temperature, and FIG. 2B is a waveform showing the base-emitter voltage $V_{BE}$ variation of the BJT to the temperature. Herein, the BJT is provided in the thermal sensor 10 shown in FIG. 1.

Referring to FIG. 2A, the base-emitter voltage $V_{BE}$ of the BJT provided in the thermal sensor 10 linearly varies according to the temperature. Referring to 2B, the base-emitter voltage $V_{BE}$ variation of the BJT linearly also varies according to the temperature.

As described above, the ODTS 100 receives the trimming code TRIM_CODE_EXT input from an external source to control the voltage levels of the maximum variation voltage DAC_HI and the minimum variation voltage DAC_LOW, thereby accurately compensating the temperature and the different range of the base-emitter voltage $V_{BE}$ of the BJT according to the temperature of each die during processing the semiconductor memory device.

Generally, a voltage measuring device located externally is used for detecting the voltage levels of the first comparing voltage VPTAT output from the thermal sensor 10 and the second comparing voltage VPDAC output from the DAC 20. However, there are errors because of an offset voltage of the externally located voltage measuring device.

Further, the ODTS 100 receives the trimming code TRIM_CODE_EXT from the external source and adjusts an internal voltage of the semiconductor memory device based on the voltage levels measured by the voltage measuring device. It is required to check whether the adjusted internal voltage is exactly outputted or not. The externally located voltage measuring device is also used for detecting the voltage levels. Accordingly, there are errors in the voltage measuring device because of the offset voltage.

For example, if a voltage difference between the first comparing voltage VPTAT and the second comparing voltage VPDAC is about 20 mV due to the offset voltage difference between an internal circuit of the semiconductor memory device and the external voltage measuring device, the thermal code THERMAL_CODE having the temperature information has an error value of 10° C.

Figure 3:
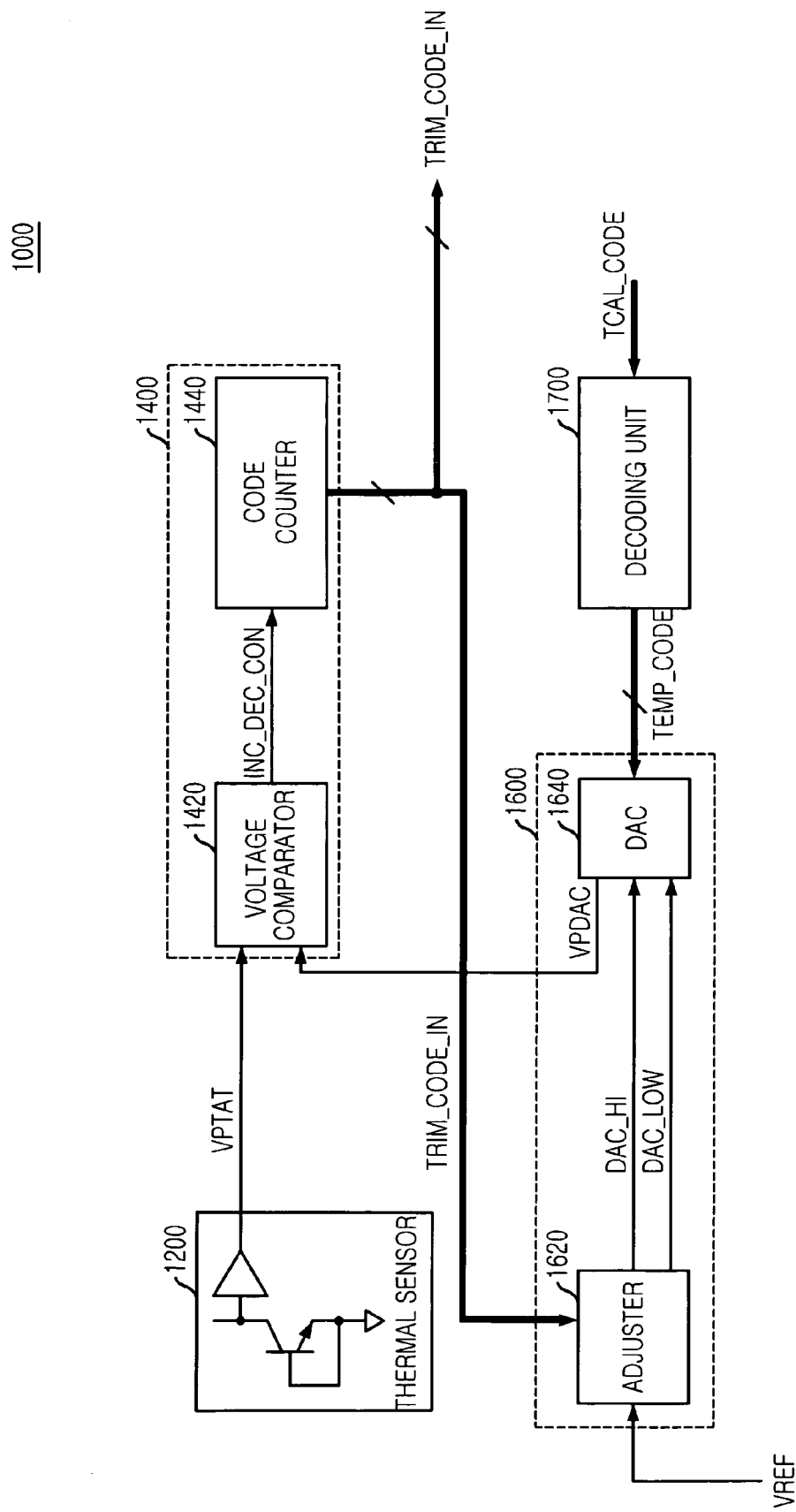
FIG. 3 is a block diagram of an ODTS in accordance with a second embodiment of the present invention.

FIG. 3 is a block diagram of an ODTS of the semiconductor memory device in accordance with a second embodiment of the present invention.

The ODTS 1000 includes a thermal sensor 1200, a comparing unit 1400, a voltage level adjusting unit 1600 and a decoding unit 1700.

The thermal sensor 1200 detects a temperature of the semiconductor memory device according to a base-emitter voltage $V_{BE}$ variation of a bipolar junction transistor (BJT) to thereby output a first comparing voltage VPTAT. Herein, the base-emitter voltage $V_{BE}$ variation of the BJT is provided in a bandgap circuit which is not under the influence of temperature and power supply voltage variation of the semiconductor memory device and is about −1.8 mV/° C.

The comparing unit 1400 compares the first comparing voltage VPTAT with a second comparing voltage VPDAC for increasing or decreasing a preset digital code in response to the comparing result, thereby outputting a trimming code TRIM_CODE_IN.

The voltage level adjusting unit 1600 receives a reference voltage VREF, determines a maximum variation voltage DAC_HI and a minimum variation voltage DAC_LOW based on the trimming code TRIM_CODE_IN, and adjusts a voltage level of the second comparing voltage VPDAC.

The decoding unit 1700 outputs a temperature control code TEMP_CODE to the voltage level adjusting unit 1600 by decoding a thermal information code TCAL_CODE.

In detail, the comparing unit 1400 includes a voltage comparator 1420 and a code counter 1440. The voltage comparator 1420 compares the first comparing voltage VPTAT with the second comparing voltage VPDAC to output a code control signal INC_DEC_CON. The code counter 1440 increases or decreases the preset digital code in response to the code control signal INC_DEC_CON output from the voltage comparator 1420, and outputs the trimming code TRIM_CODE_IN.

When the first comparing voltage VPTAT is smaller than the second comparing voltage VPDAC, the code counter 1440 decreases the preset digital code based on the code control signal INC_DEC_CON. When the first comparing voltage VPTAT is larger than the second comparing voltage VPDAC, the code counter 1440 increases the preset digital code based on the code control signal INC_DEC_CON.

Further, the voltage level adjusting unit 1600 includes an adjuster 1620 and a digital to analog converter (DAC) 1640.

The adjuster 1620 outputs the maximum variation voltage DAC_HI and the minimum variation voltage DAC_LOW based on the trimming code TRIM_CODE_IN and the reference voltage VREF. Herein, the maximum variation voltage DAC_HI is a maximum voltage level of the second comparing voltage VPDAC and the minimum variation voltage DAC_LOW is a minimum voltage level of the second comparing voltage VPDAC.

The DAC 1640 receives the maximum variation voltage DAC_HI and the minimum variation voltage DAC_LOW and determines the voltage level of the second comparing voltage VPDAC according to the temperature control code TEMP_CODE or the thermal information code TCAL_CODE. Herein, the thermal information code TCAL_CODE may be inputted through the decoding unit 1700 or not. That is, the DAC 1640 may determine the voltage level of the second comparing voltage VPDAC in response to one of the temperature control code TEMP_CODE and the thermal information code TCAL_CODE.

Figure 4:
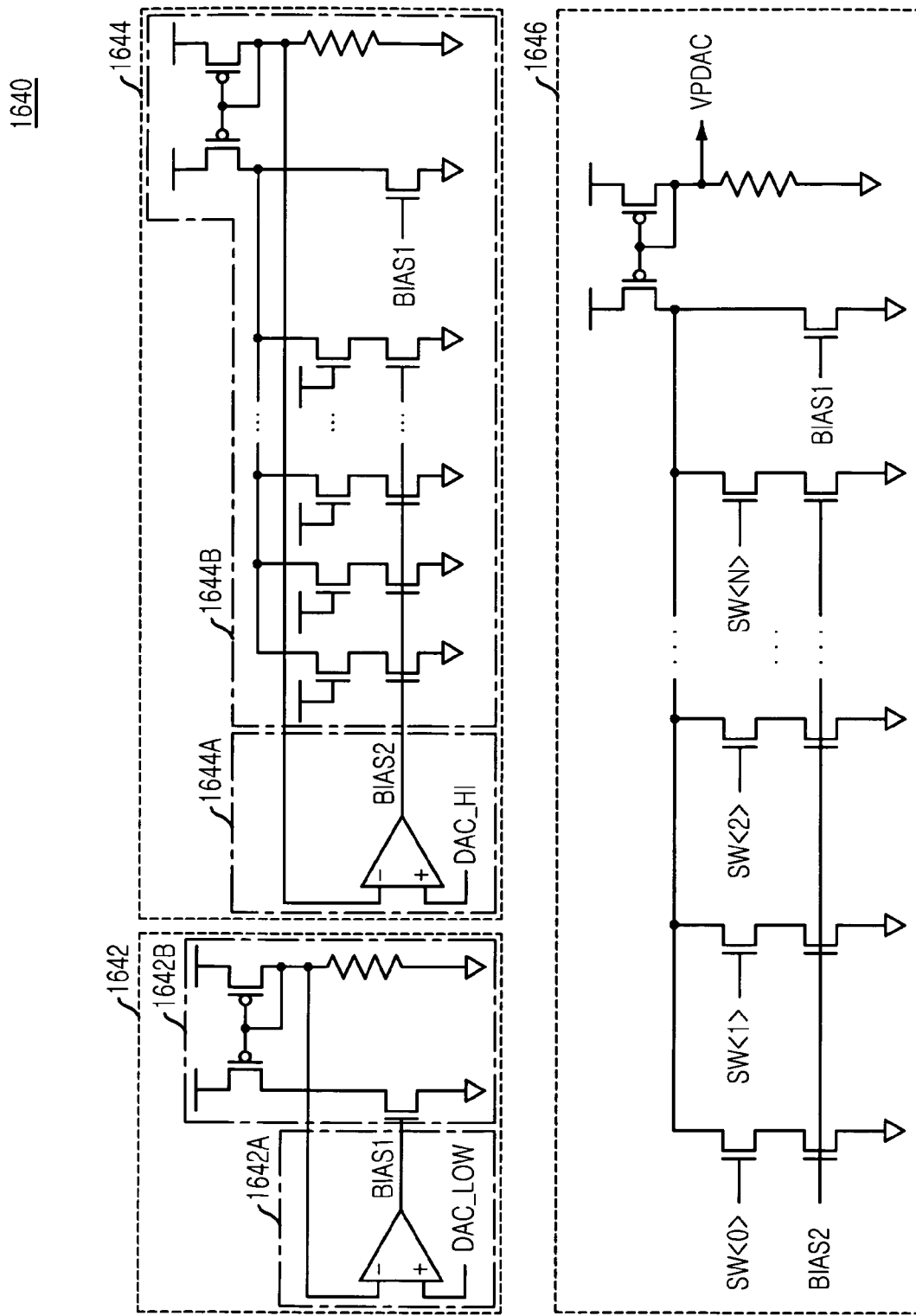
FIG. 4 is a detailed circuit diagram of a digital to analog converter (DAC) of the ODTS shown in FIG. 3.

FIG. 4 is a detailed circuit diagram of the DAC 1640 of the ODTS shown in FIG. 3.

The DAC 1640 includes a first bias determination unit 1642, a second bias determination unit 1644, and a second comparing voltage determination unit 1646.

The first bias determination unit 1642 determines a voltage level of a first bias voltage BIAS1 by comparing a first output voltage OUT_1 with the minimum variation voltage DAC_LOW. Herein, a voltage level of the first output voltage OUT_1 is controlled by the voltage level of the first bias voltage BIAS1.

The second bias determination unit 1644 determines a voltage level of a second bias voltage BIAS2 by comparing a second output voltage OUT_2 with the maximum variation voltage DAC_HI. Herein, a voltage level of the second output voltage OUT_2 is controlled by the voltage level of the second bias voltage BIAS2.

The second comparing voltage determination unit 1646 is enabled under the control of the thermal information code TCAL_CODE or the temperature control code TEMP_CODE and determines the voltage level of the second comparing voltage VPDAC based on the first and second bias voltages BIAS1 and BIAS2 output from the first and second bias determination units 1642 and 1644.

In detail, the first bias determination unit 1642 includes a first comparator 1642A and a first current mirror circuit 1642B. The first current mirror circuit 1642B determines the voltage level of the first output voltage OUT_1 based on the first bias voltage BIAS1. The first comparator 1642A outputs the first bias voltage BIAS1 by comparing the first output voltage OUT_1 with the minimum variation voltage DAC_LOW.

The second bias determination unit 1644 includes a second comparator 1644A and a second current mirror circuit 1644B. The second current mirror circuit 1644B determines the voltage level of the second output voltage OUT_2 based on the second bias voltage BIAS2. The second comparator 1644A outputs the second bias voltage BIAS2 by comparing the second output voltage OUT_2 with the maximum variation voltage DAC_HI.

The second comparing voltage determination unit 1646 includes a third current mirror circuit which is enabled under the control of the thermal information code TCAL_CODE or the temperature control code TEMP_CODE as shown in SW<0>, SW<1> to SW<N> of FIG. 4, and determines the voltage level of the second comparing voltage VPDAC based on the first and second bias voltages BIAS1 and BIAS2.

If all of SW<0>, SW<1> to SW<N> of FIG. 4 are a logic high level, the voltage level of the second comparing voltage VPDAC is substantially the same as that of the maximum variation voltage DAC_HI. If all of SW<0>, SW<1> to SW<N> of FIG. 4 are a logic low level, the voltage level of the second comparing voltage VPDAC is substantially the same as that of the minimum variation voltage DAC_LOW. Accordingly, the voltage level of the second comparing voltage VPDAC has a value between the maximum variation voltage DAC_HI and the minimum variation voltage DAC_LOW under the control of one of the thermal information code TCAL_CODE or the temperature control code TEMP_CODE.

Figure 5:
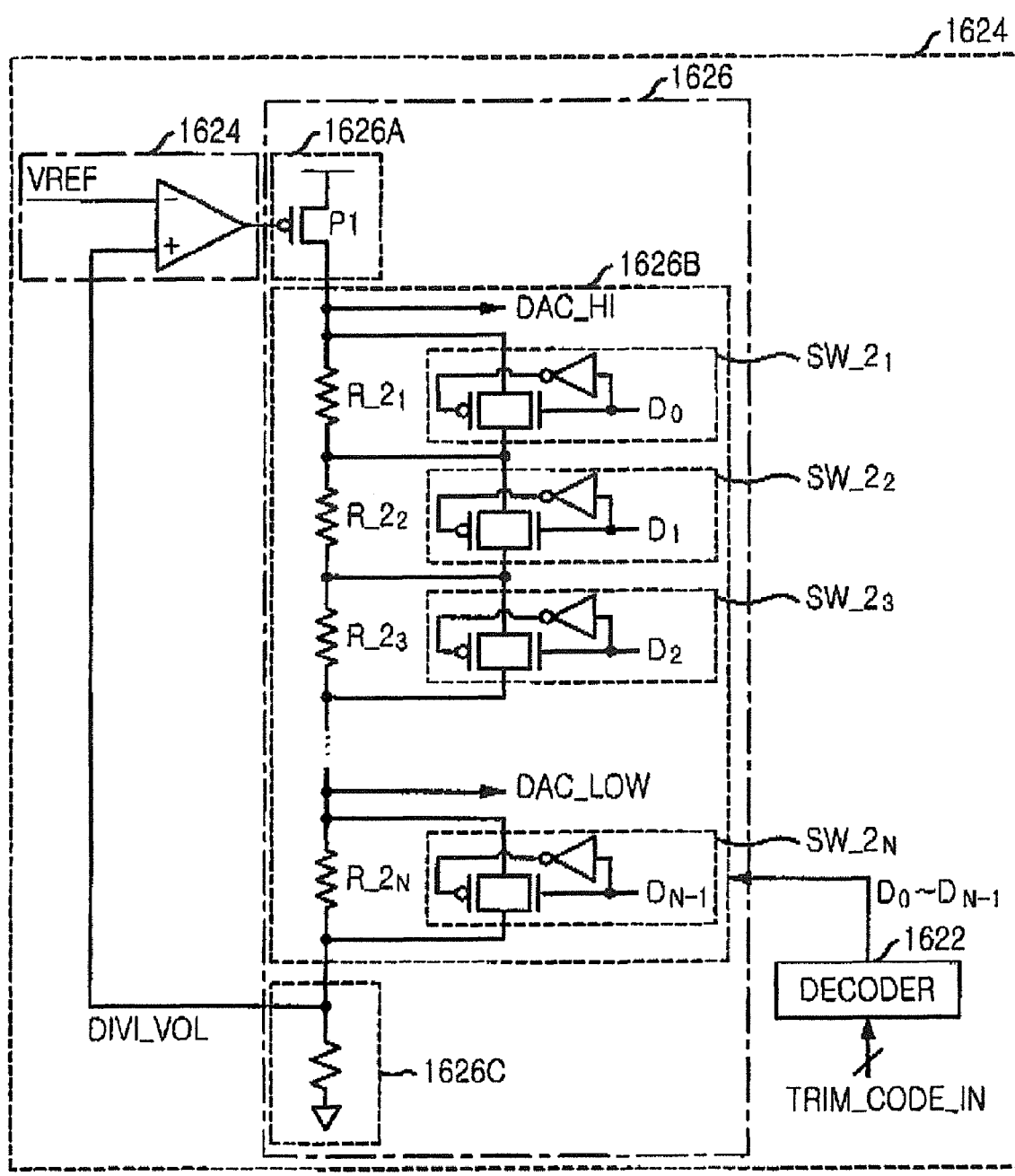
FIG. 5 is a detailed circuit diagram of an adjuster of the ODTS shown in FIG. 3.

FIG. 5 is a detailed circuit diagram of the adjuster 1620 of the ODTS shown in FIG. 3.

The adjuster 1620 includes a decoder 1622, a comparing controller 1624, and a voltage adjuster 1626. The decoder 1622 receives and decodes the trimming code TRIM_CODE_IN to generate a variation adjusting code $D_0$ to $D_{N-1}$. The voltage adjuster 1626 adjusts the voltage levels of the maximum variation voltage DAC_HI and the minimum variation voltage DAC_LOW based on the variation adjusting code $D_0$ to $D_{N-1}$. Further, the voltage adjuster 1626 outputs a division voltage DIVI_VOL based on the maximum variation voltage DAC_HI and the minimum variation voltage DAC_LOW. The comparing controller 1624 controls the voltage adjuster 1626 by comparing the reference voltage VREF with the division voltage DIVI_VOL.

In detail, the voltage adjuster 1626 includes an output controller 1626A, a variation voltage adjuster 1626B, and a division voltage adjuster 1626C. The output controller 1626A controls generation of the maximum variation voltage DAC_HI and the minimum variation voltage DAC_LOW in response to an output of the comparing controller 1624. The variation voltage adjuster 1626B adjusts voltage levels of the maximum variation voltage DAC_HI and the minimum variation voltage DAC_LOW in response to the variation adjusting code $D_0$ to $D_{N-1}$. The division voltage adjuster 1626C adjusts a voltage level of the division voltage DIVI_VOL in response to the maximum variation voltage DAC_HI and the minimum variation voltage DAC_LOW.

The output controller 1626A includes a PMOS transistor P1 having a gate receiving the output of the comparing controller 1624, and a source-drain path between a power supply voltage terminal and one terminal of the variation voltage adjuster 1626B.

The variation voltage adjuster 1626B includes a plurality of resistors $R\_2_1, R\_2_2, \ldots, R\_2_N$ connected in series and a plurality of switching units $SW\_2_1, SW\_2_2, \ldots, SW\_2_N$. Each switching unit connected in parallel with a corresponding one of the resistors includes a transfer gate which is turned on under the control of the variation adjusting code $D_0$ to $D_{N-1}$.

The division voltage adjuster 1626C includes a fixed resistor as compared with the variation voltage adjuster 1626B which acts as a variable resistor because of the plurality of resistors $R\_2_1, R\_2_2, \ldots, R\_2_N$.

As described above, the adjuster 1620 determines whether each of the resistors $R\_2_1, R\_2_2, \ldots, R\_2_N$ operates or not according to the trimming code TRIM_CODE_IN so as to adjust the voltage level of the maximum variation voltage DAC_HI and the voltage level of the minimum variation voltage DAC_LOW having a predetermined voltage difference from that of the maximum variation voltage DAC_HI.

Meanwhile, the reference voltage VREF is generated by a bandgap circuit which is not under the influence of process, voltage and temperature (PVT) variation of the semiconductor memory device. The thermal sensor 1200 of the ODTS detects the base-emitter voltage $V_{BE}$ variation of the BJT about −1.8 mV/° C. and thus the ODTS is very sensitive. Even if the variation occurs slightly during process, e.g., 10 mV, a difference between an output value detected by the ODTS and a real temperature is extremely large. The reference voltage VREF is generated by adjusting the process variation of the bandgap circuit in advance through an external device.

However, though the process variation of the bandgap circuit is adjusted by using the external device, the difference still remains due to process variations of the other circuit except for the bandgap circuit. Accordingly, the ODTS may automatically compensate the difference due to process variations of the other circuit except for the bandgap circuit.

As described above, the on die thermal sensor (ODTS) in accordance with the second embodiment of the present invention uses the thermal information code TCAL_CODE which is preset in advance in consideration of the base-emitter voltage $V_{BE}$ variation of the BJT to generate the trimming code TRIM_CODE_IN from the internal circuit. As a result, the ODTS can accurately compensate the temperature without measuring an internal voltage by using an external measuring device. Accordingly, it is possible to prevent the external measuring device from generating an error due to an offset voltage between the internal circuit and the external measuring device.

Referring to FIGS. 3 to 5, an operation of the ODTS 1000 of the second embodiment is described in detail.

At a first step, the thermal sensor 1200 detects the temperature of the semiconductor memory device according to the base-emitter voltage $V_{BE}$ variation of the BJT to thereby output the first comparing voltage VPTAT.

At a second step, the voltage level adjusting unit 1600 determines and outputs an initial voltage level of the second comparing voltage VPDAC in response to the temperature control code TEMP_CODE generated by decoding the thermal information code TCAL_CODE.

At a third step, the comparing unit 1400 compares the first comparing voltage VPTAT with the second comparing voltage VPDAC and increases or decreases the preset digital code in response to the comparing result, thereby outputting the trimming code TRIM_CODE_IN.

At a fourth step, the adjuster 1620 outputs the maximum variation voltage DAC_HI and the minimum variation voltage DAC_LOW of the second comparing voltage VPDAC based on the trimming code TRIM_CODE_IN.

At a fifth step, the DAC 1640 determines the voltage level of the second comparing voltage VPDAC according to the maximum variation voltage DAC_HI and the minimum variation voltage DAC_LOW.

The above-mentioned third to fifth steps are repeated until the voltage level of the second comparing voltage VPDAC is substantially the same as that of the first comparing voltage VPTAT. Further, the second step may be omitted. That is, the initial voltage level of the second comparing voltage VPDAC can be determined under the control of the thermal information code TCAL_CODE.

Figure 6:
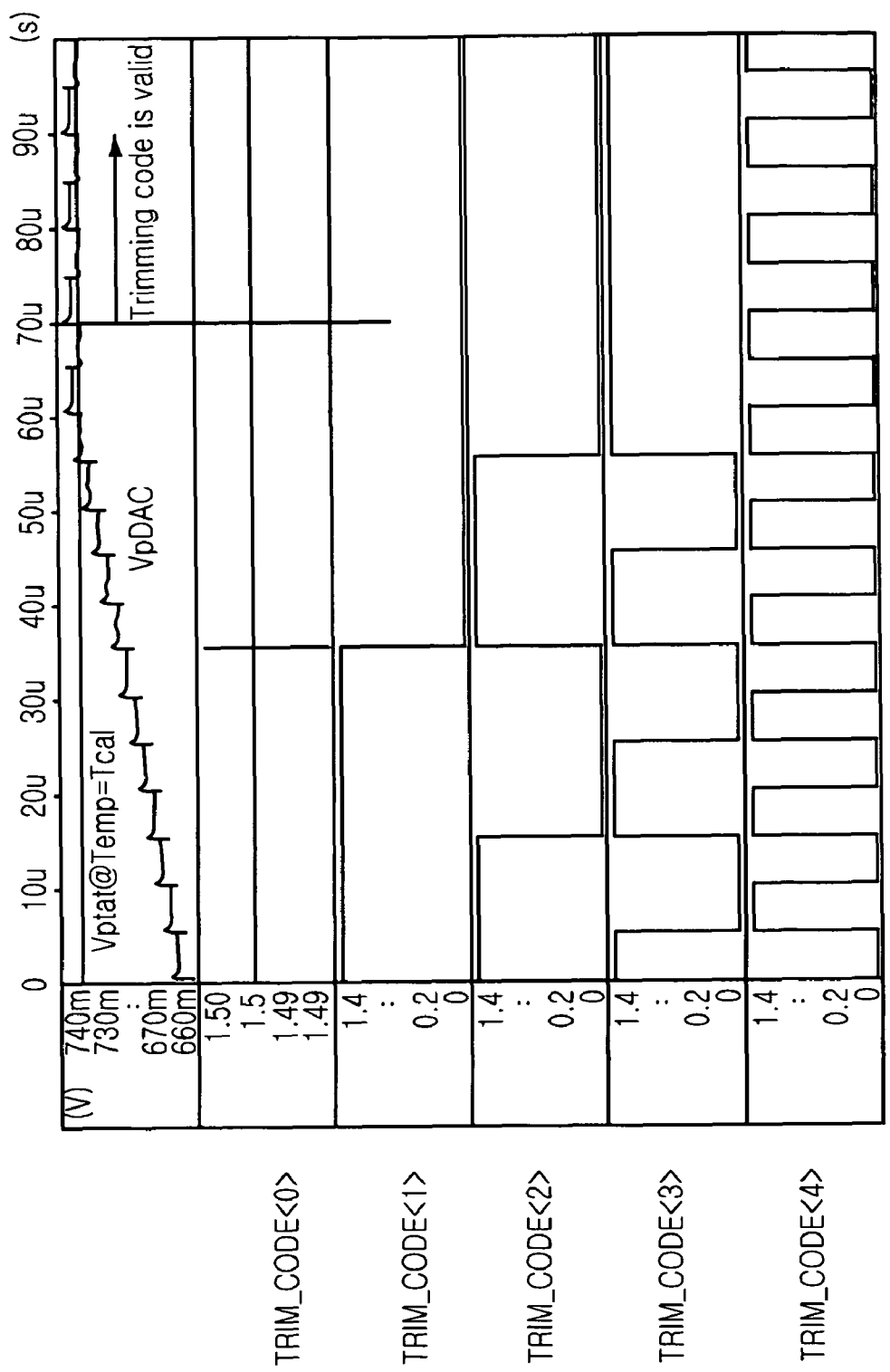
FIG. 6 is a waveform showing an operation of the ODTS shown in FIG. 3.

FIG. 6 is a waveform showing an operation of the ODTS 1000 in accordance with the second embodiment of the present invention.

Referring to FIG. 6, the first comparing voltage VPTAT is generated with a specific value, i.e., about 740 mV, based on the base-emitter voltage $V_{BE}$ variation of the BJT, and then the second comparing voltage VPDAC increases until the second comparing voltage VPDAC is substantially the same as the first comparing voltage VPTAT.

When the second comparing voltage VPDAC is substantially the same as the first comparing voltage VPTAT, the trimming code TRIM_CODE_IN<0> to TRIM_CODE_IN<4> generated internally is outputted as a valid adjust code with temperature information.

Figure 7:
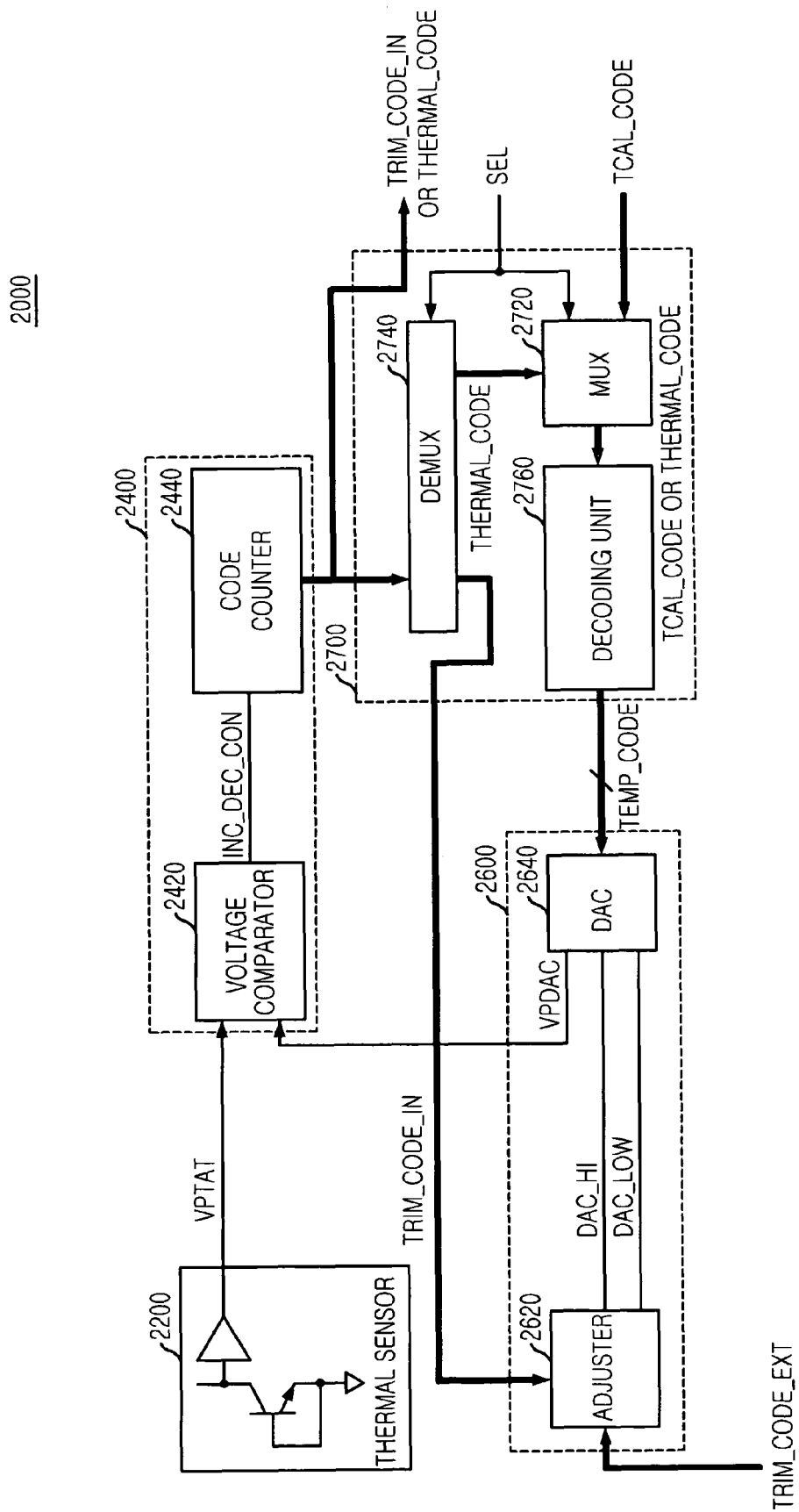
FIG. 7 is a block diagram of an ODTS in accordance with a third embodiment of the present invention.

FIG. 7 is a block diagram of an ODTS in accordance with a third embodiment of the present invention.

The ODTS 2000 includes a thermal sensor 2200, a comparing unit 2400, a voltage level adjusting unit 2600 and a decoding selection unit 2700.

The thermal sensor 2200 detects a temperature of the semiconductor memory device according to a base-emitter voltage $V_{BE}$ variation of a bipolar junction transistor (BJT) to thereby output a first comparing voltage VPTAT. Herein, the base-emitter voltage $V_{BE}$ variation of the BJT is provided in a bandgap circuit which is not under the influence of temperature and power supply voltage variation of the semiconductor memory device and is about −1.8 mV/° C.

The comparing unit 2400 compares the first comparing voltage VPTAT with a second comparing voltage VPDAC and increases or decreases a preset digital code in response to the comparing result, thereby outputting a first trimming code TRIM_CODE_IN in case of a first test mode and outputting a thermal code THERMAL_CODE in case of a second test mode. In detail, the comparing unit 2400 includes a voltage comparator 2420 and a code counter 2440 performing the same operation as those of the voltage comparator 1420 and the code counter 1440 of the ODTS 1000 shown in FIG. 3 in accordance with the second embodiment of the present invention.

The voltage level adjusting unit 2600 determines a maximum variation voltage DAC_HI and a minimum variation voltage DAC_LOW based on the first trimming code TRIM_CODE_IN in case of the first test mode and based on a preset second trimming code TRIM_CODE_EXT in case of the second test mode, thereby adjusting a voltage level of the second comparing voltage VPDAC. In detail, the voltage level adjusting unit 2600 includes an adjuster 2620 and a digital to analog converter (DAC) 2640. Herein, the DAC 2640 performs the same operation as that of the DAC 1640 of the ODTS 1000 shown in FIG. 3.

The decoding selection unit 2700 outputs a temperature control code TEMP_CODE to the voltage level adjusting unit 2600 by decoding a preset thermal information code TCAL_CODE in case of the first test mode, and decoding the thermal code THERMAL_CODE in case of the second test mode.

In case of the first test mode, the ODTS 2000 in accordance with the third embodiment of the present invention performs the same operation as that of the ODTS 1000 shown in FIG. 3 in accordance with the second embodiment. In case of the second test mode, the ODTS 2000 performs the same operation as that of the ODTS 100 shown in FIG. 1 in accordance with the first embodiment.

Hereinafter, differences between the ODTS 2000 of the third embodiment and the other ODTS 100 and 1000 are explained in detail. In other words, the adjuster 2620 and the decoding selection unit 2700 are only explained.

The adjuster 2620 determines voltage levels of the maximum variation voltage DAC_HI and the minimum variation voltage DAC_LOW based on the first trimming code TRIM_CODE_IN in case of the first test mode, and determines the maximum variation voltage DAC_HI and the minimum variation voltage DAC_LOW based on the preset second trimming code TRIM_CODE_EXT in case of the second test mode. That is, the ODTS 2000 uses the first trimming code TRIM_CODE_IN which is generated internally in case of the first test mode, and uses the second trimming code TRIM_CODE_EXT input from an external source.

The decoding selection unit 2700 includes a multiplexer 2720, a demultiplexer 2740, and a decoder 2760. The multiplexer 2720 selects one of the thermal information code TCAL_CODE and the thermal code THERMAL_CODE in response to a selection signal SEL. The demultiplexer 2740 outputs the first trimming code TRIM_CODE_IN to the adjuster 2620 in case of the first test mode, and outputs the thermal code THERMAL_CODE to the multiplexer 2720 in case of the second test mode, under the control of the selection signal SEL. The decoder 2760 outputs the temperature control code TEMP_CODE to the DAC 2640 of the voltage level adjusting unit 2600 by decoding an output code of the multiplexer 2720. Herein, the selection signal SEL is activated at the first test mode, and is inactivated at the second test mode.

As described above, the ODTS 100 in accordance with the first embodiment uses the trimming code TRIM_CODE_EXT input from the external source, and the ODTS 1000 in accordance with the second embodiment uses the trimming code TRIM_CODE_IN generated internally to accurately compensate the temperature. Further, the ODTS 2000 in accordance with the third embodiment uses both of the first trimming code TRIM_CODE_IN generated internally and the second trimming code TRIM_CODE_EXT input from the external source, according to the first and second test modes. A user can set the test mode by controlling the selection signal SEL.

As described above, the ODTS of the present invention uses the thermal information code TCAL_CODE which is preset in advance in consideration of the base-emitter voltage $V_{BE}$ variation of the BJT to generate the trimming code TRIM_CODE_IN from the internal. As a result, the ODTS of the present invention can accurately compensate the temperature without measuring an internal voltage by using an external device. Accordingly, it is possible to prevent the external measuring device from generating an error due to an offset voltage between the internal circuit and the external device.

The present application contains subject matter related to Korean patent application Nos. 2005-91666 & 2006-51145, filed in the Korean Patent Office on Sep. 29, 2005 & Jun. 7, 2006, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An on die thermal sensor (ODTS) of a semiconductor device, comprising:
    a thermal sensor for outputting a first comparing voltage by detecting a temperature of the semiconductor device;
    a comparing unit for outputting a trimming code by comparing the first comparing voltage with a second comparing voltage and increasing or decreasing a preset digital code in response to the comparing result; and
    a voltage level adjusting unit for adjusting a voltage level of the second comparing voltage by determining a variation width of the voltage level of the second comparing voltage based on the trimming code and a temperature control code.

2. The ODTS as recited in claim 1, further comprising a decoding unit for outputting the temperature control code by decoding a preset thermal information code.

3. The ODTS as recited in claim 1, wherein the variation width of the voltage level of the second comparing voltage ranges from a minimum variation voltage to a maximum variation voltage.

4. The ODTS as recited in claim 3, wherein the voltage level adjusting unit includes:
    an adjuster for outputting the maximum variation voltage and the minimum variation voltage based on the trimming code and a preset reference voltage; and
    a digital to analog converter (DAC) for receiving the maximum variation voltage and the minimum variation voltage and determining the voltage level of the second comparing voltage based on one of the temperature control code and a preset thermal information code.

5. The ODTS as recited in claim 4, wherein the maximum variation voltage is a maximum voltage level of the second comparing voltage and the minimum variation voltage is a minimum voltage level of the second comparing voltage.

6. The ODTS as recited in claim 5, wherein the adjuster includes:
    a decoder for decoding the trimming code and generating a variation adjusting code;
    a voltage adjuster for adjusting voltage levels of the maximum variation voltage and the minimum variation voltage in response to the variation adjusting code and outputting a division voltage based on the adjusted voltage levels of the maximum variation voltage and the minimum variation voltage; and
    a comparing controller for comparing the reference voltage with the division voltage and controlling the voltage adjuster based on the compared result.

7. The ODTS as recited in claim 6, wherein the voltage adjuster includes:
    an output controller for controlling the maximum variation voltage and the minimum variation voltage in response to an output of the comparing controller;
    a variation voltage adjuster for adjusting the voltage levels of the maximum variation voltage and the minimum variation voltage in response to the variation adjusting code; and a division voltage adjuster for adjusting a voltage level of the division voltage in response to the adjusted voltage levels of the maximum variation voltage and the minimum variation voltage.

8. The ODTS as recited in claim 7, wherein the output controller includes a transistor having a gate receiving the output of the comparing controller and a source-drain path between a power supply voltage terminal and one terminal of the variation voltage adjuster.

9. The ODTS as recited in claim 7, wherein the variation voltage adjuster includes:
a plurality of resistors connected in series; and
a plurality of switching units, each of which is connected in parallel with a corresponding one of the resistors and turned on under the control of the variation adjusting code.

10. The ODTS as recited in claim 9, wherein each of the switching units includes a transfer gate which is turned on in response to the variation adjusting code.

11. The ODTS as recited in claim 6, wherein the DAC includes:
a first bias determination unit for determining a voltage level of a first bias voltage by comparing a first output voltage with the minimum variation voltage, wherein a voltage level of the first output voltage is controlled by the voltage level of the first bias voltage;
a second bias determination unit for determining a voltage level of a second bias voltage by comparing a second output voltage with the maximum variation voltage, wherein a voltage level of the second output voltage is controlled by the voltage level of the second bias voltage; and
a second comparing voltage determination unit, enabled under the control of one of the preset thermal information code and the temperature control code, for determining the voltage level of the second comparing voltage based on the first and second bias voltages.

12. The ODTS as recited in claim 11, wherein the first bias determination unit includes:
a current mirror circuit for determining the voltage level of the first output voltage based on the first bias voltage; and
a comparator for outputting the first bias voltage by comparing the first output voltage with the minimum variation voltage.

13. The ODTS as recited in claim 11, wherein the second bias determination unit includes:
a current mirror circuit for determining the voltage level of the second output voltage based on the second bias voltage; and
a comparator for outputting the second bias voltage by comparing the second output voltage with the maximum variation voltage.

14. The ODTS as recited in claim 11, wherein the second comparing voltage determination unit includes a current mirror circuit, enabled under the control of one of the thermal information code and the temperature control code, for determining the voltage level of the second comparing voltage based on the first and second bias voltages.

15. The ODTS as recited in claim 1, wherein the comparing unit includes:
a voltage comparator for comparing the first comparing voltage with the second comparing voltage to output a code control signal; and
a code counter for increasing or decreasing the preset digital code in response to the code control signal output from the voltage comparator, thereby outputting the trimming code.

16. An on die thermal sensor (ODTS) of a semiconductor device, comprising:
a thermal sensor for outputting a first comparing voltage by detecting a temperature of the semiconductor device;
a comparing unit for outputting a first trimming code in case of a first test mode and a thermal code in case of a second test mode by comparing the first comparing voltage with a second comparing voltage and increasing or decreasing a preset digital code in response to the comparing result;
a voltage level adjusting unit for determining a variation width of a voltage level of the second comparing voltage based on the first trimming code in case of the first test mode and a preset second trimming code in case of the second test mode, thereby adjusting the voltage level of the second comparing voltage in response to a temperature control code; and
a decoding selection unit for decoding a preset thermal information code in case of the first test mode and the thermal code in case of the second test mode, thereby outputting the temperature control code.

17. The ODTS as recited in claim 16, wherein the variation width of the voltage level of the second comparing voltage ranges from a minimum variation voltage to a maximum variation voltage.

18. The ODTS as recited in claim 17, wherein the voltage level adjusting unit includes:
an adjuster for adjusting voltage levels of the maximum variation voltage and the minimum variation voltage based on the first trimming code in case of the first test mode and the second trimming code in case of the second test mode; and
a digital to analog converter (DAC) for receiving the maximum variation voltage and the minimum variation voltage to determine the voltage level of the second comparing voltage based on the temperature control code.

19. The ODTS as recited in claim 18, wherein the maximum variation voltage is a maximum voltage level of the second comparing voltage and the minimum variation voltage is a minimum voltage level of the second comparing voltage.

20. The ODTS as recited in claim 19, wherein the adjuster includes:
a decoder for generating a variation adjusting code by decoding the first trimming code in case of the first test mode and the second trimming code in case of the second test mode;
a voltage adjuster for adjusting voltage levels of the maximum variation voltage and the minimum variation voltage in response to the variation adjusting code and outputting a division voltage by adjusting the voltage levels of the maximum variation voltage and the minimum variation voltage in response to the variation adjusting code; and
a comparing controller for comparing the reference voltage with the division voltage to control the voltage adjuster based on the compared result.

21. The ODTS as recited in claim 20, wherein the voltage adjuster includes:
an output controller for controlling the generation of the maximum variation voltage and the minimum variation voltage in response to an output of the comparing controller;

a variation voltage adjuster for adjusting the voltage levels of the maximum variation voltage and the minimum variation voltage in response to the variation adjusting code; and a division voltage adjuster for adjusting a voltage level of the division voltage in response to the adjusted voltage levels of the maximum variation voltage and the minimum variation voltage.

22. The ODTS as recited in claim 21, wherein the output controller includes a transistor having a gate receiving the output of the comparing controller and a source-drain path between a power supply voltage terminal and one terminal of the variation voltage adjuster.

23. The ODTS as recited in claim 21, wherein the variation voltage adjuster includes:
  a plurality of resistors connected in series; and
  a plurality of switching units, each of which is connected in parallel with a corresponding one of the resistors and turned on under the control of the variation adjusting code.

24. The ODTS as recited in claim 23, wherein each of the switching units includes a transfer gate which is turned on in response to the variation adjusting code.

25. The ODTS as recited in claim 20, wherein the DAC includes:
  a first bias determination unit for determining a voltage level of a first bias voltage by comparing a first output voltage with the minimum variation voltage, wherein a voltage level of the first output voltage is controlled by the voltage level of the first bias voltage;
  a second bias determination unit for determining a voltage level of a second bias voltage by comparing a second output voltage with the maximum variation voltage, wherein a voltage level of the second output voltage is controlled by the voltage level of the second bias voltage; and
  a second comparing voltage determination unit, enabled under the control of one of the preset thermal information code and the temperature control code, for determining the voltage level of the second comparing voltage based on the first and second bias voltages.

26. The ODTS as recited in claim 25, wherein the first bias determination unit includes:
  a current mirror circuit for determining the voltage level of the first output voltage based on the first bias voltage; and
  a comparator for outputting the first bias voltage by comparing the first output voltage with the minimum variation voltage.

27. The ODTS as recited in claim 25, wherein the second bias determination unit includes:
  a current mirror circuit for determining the voltage level of the second output voltage based on the second bias voltage; and
  a comparator for outputting the second bias voltage by comparing the second output voltage with the maximum variation voltage.

28. The ODTS as recited in claim 25, wherein the second comparing voltage determination unit includes a current mirror circuit, enabled under the control of one of the thermal information code and the temperature control code, for determining the voltage level of the second comparing voltage based on the first and second bias voltages.

29. The ODTS as recited in claim 17, wherein the comparing unit includes:
  a voltage comparator for comparing the first comparing voltage with the second comparing voltage to output a code control signal; and
  a code counter for increasing or decreasing the preset digital code in response to the code control signal output from the voltage comparator to thereby output the first trimming code in case of the first test mode and output the thermal code in case of the second test mode.

30. The ODTS as recited in claim 17, wherein the decoding selection unit includes:
  a multiplexer for selecting one of the thermal information code and the thermal code in response to a selection signal;
  a demultiplexer for outputting the first trimming code to the voltage level adjusting unit in case of the first test mode and the thermal code to the multiplexer in case of the second test mode under the control of the selection signal; and
  a decoder for outputting the temperature control code to the voltage level adjusting unit by decoding an output code of the multiplexer.

31. The ODTS as recited in claim 30, wherein the selection signal is enabled in the first test mode and disabled in the second test mode.

32. A method for detecting an on die temperature of a semiconductor device, the method comprising the steps of:
  (a) outputting a first comparing voltage by detecting temperature variation of the semiconductor device;
  (b) generating a trimming code by comparing the first comparing voltage with a second comparing voltage and increasing or decreasing a preset digital code in response to the comparing result;
  (c) setting a variation width of voltage level of the second comparing voltage based on the trimming code; and
  (d) determining a voltage level of the second comparing voltage based on the variation width of voltage level of the second comparing voltage so that the voltage level of the second comparing voltage is the same as that of the first comparing voltage.

33. The ODTS as recited in claim 32, wherein the variation width of the voltage level of the second comparing voltage ranges from a minimum variation voltage to a maximum variation voltage.

34. The method as recited in claim 33, wherein the maximum variation voltage is a maximum voltage level of the second comparing voltage and the minimum variation voltage is a minimum voltage level of the second comparing voltage.

35. The method as recited in claim 33, further comprising, between the step (a) and the step (b), a step of determining an initial voltage level of the second comparing voltage in response to a temperature control code generated by decoding thermal information.

36. The method as recited in claim 33, wherein the steps (b) to (d) are repeated until the voltage level of the second comparing voltage is the same as that of the first comparing voltage.

* * * * *